(12) United States Patent
Tsai et al.

(10) Patent No.: US 9,818,690 B2
(45) Date of Patent: Nov. 14, 2017

(54) SELF-ALIGNED INTERCONNECTION STRUCTURE AND METHOD

(71) Applicant: Taiwan Semiconductor Manufacturing Company, Ltd., Hsin-Chu (TW)

(72) Inventors: Jung-Hsun Tsai, Taoyuan (TW); Chi-Lin Teng, Taichung (TW); Kai-Fang Cheng, Taoyuan County (TW); Hsin-Yen Huang, Taipei County (TW); Hai-Ching Chen, Hsinchu (TW); Tien-I Bao, Taoyuan County (TW); Chien-Hua Huang, Miaoli County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/928,916

(22) Filed: Oct. 30, 2015

(65) Prior Publication Data

US 2017/0125340 A1  May 4, 2017

(51) Int. Cl.
| | |
|---|---|
| *H01L 21/4763* | (2006.01) |
| *H01L 23/522* | (2006.01) |
| *H01L 21/02* | (2006.01) |
| *H01L 23/532* | (2006.01) |
| *H01L 23/528* | (2006.01) |

(Continued)

(52) U.S. Cl.
CPC ...... *H01L 23/5226* (2013.01); *H01L 21/0206* (2013.01); *H01L 21/0228* (2013.01); *H01L 21/02178* (2013.01); *H01L 21/02181* (2013.01); *H01L 21/02189* (2013.01); *H01L 21/31111* (2013.01); *H01L 21/31144* (2013.01); *H01L 21/7684* (2013.01); *H01L 21/76807* (2013.01); *H01L 21/76877* (2013.01); *H01L 21/76897* (2013.01); *H01L 23/528* (2013.01); *H01L 23/53228* (2013.01); *H01L 23/53295* (2013.01)

(58) Field of Classification Search
CPC .................................................. H01L 21/76834
USPC .......................................................... 438/634
See application file for complete search history.

(56) References Cited

U.S. PATENT DOCUMENTS

| | | | |
|---|---|---|---|
| 7,339,271 B2 * | 3/2008 | Morrow | ............ H01L 21/76829 257/758 |
| 7,667,271 B2 | 2/2010 | Yu et al. | |

(Continued)

*Primary Examiner* — Hsin-Yi Hsieh
(74) *Attorney, Agent, or Firm* — Haynes and Boone, LLP (57) ABSTRACT

The present disclosure provides a method that includes providing a substrate having a first dielectric material layer and first conductive features that are laterally separated from each other by segments of the first dielectric material layer; depositing a first etch stop layer on the first dielectric material layer and the first conductive features, thereby forming the first etch stop layer having oxygen-rich portions self-aligned with the segments of the first dielectric material layer and oxygen-poor portions self-aligned with the first conductive features; performing a selective removal process to selectively remove the oxygen-poor portions of the first etch stop layer; forming a second etch stop layer on the first conductive features and the oxygen-rich portions of the first etch stop layer; forming a second dielectric material layer on the second etch stop layer; and forming a conductive structure in the second dielectric material layer.

20 Claims, 8 Drawing Sheets

(51) Int. Cl.
*H01L 21/768* (2006.01)
*H01L 21/311* (2006.01)

(56) References Cited

U.S. PATENT DOCUMENTS

| | | |
|---|---|---|
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2013/0228837 A1 | 9/2013 | Sukekawa et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0377928 A1 | 12/2014 | Hu et al. |
| 2015/0155359 A1 | 6/2015 | Tsai et al. |

\* cited by examiner

SELF-ALIGNED INTERCONNECTION STRUCTURE AND METHOD

BACKGROUND

In semiconductor technology, an integrated circuit pattern can be defined on a substrate using a photolithography process. Dual damascene processes are utilized to form multilayer copper interconnections including vertical interconnection vias/contacts and horizontal interconnection metal lines. During a dual damascene process, a plug filling material is employed to fill in the vias (or contacts) and the material is then polished back. However, the vias (or contacts) are defined by a different lithography process and may cause misalignments between the underlying metal lines and the vias. Especially, when the semiconductor technologies move forward to advanced technology nodes with smaller feature sizes, such as 20 nm, 16 nm or less, the misalignments have less tolerance and may cause short, opening or other issues.

Therefore, the present disclosure provides an interconnection structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
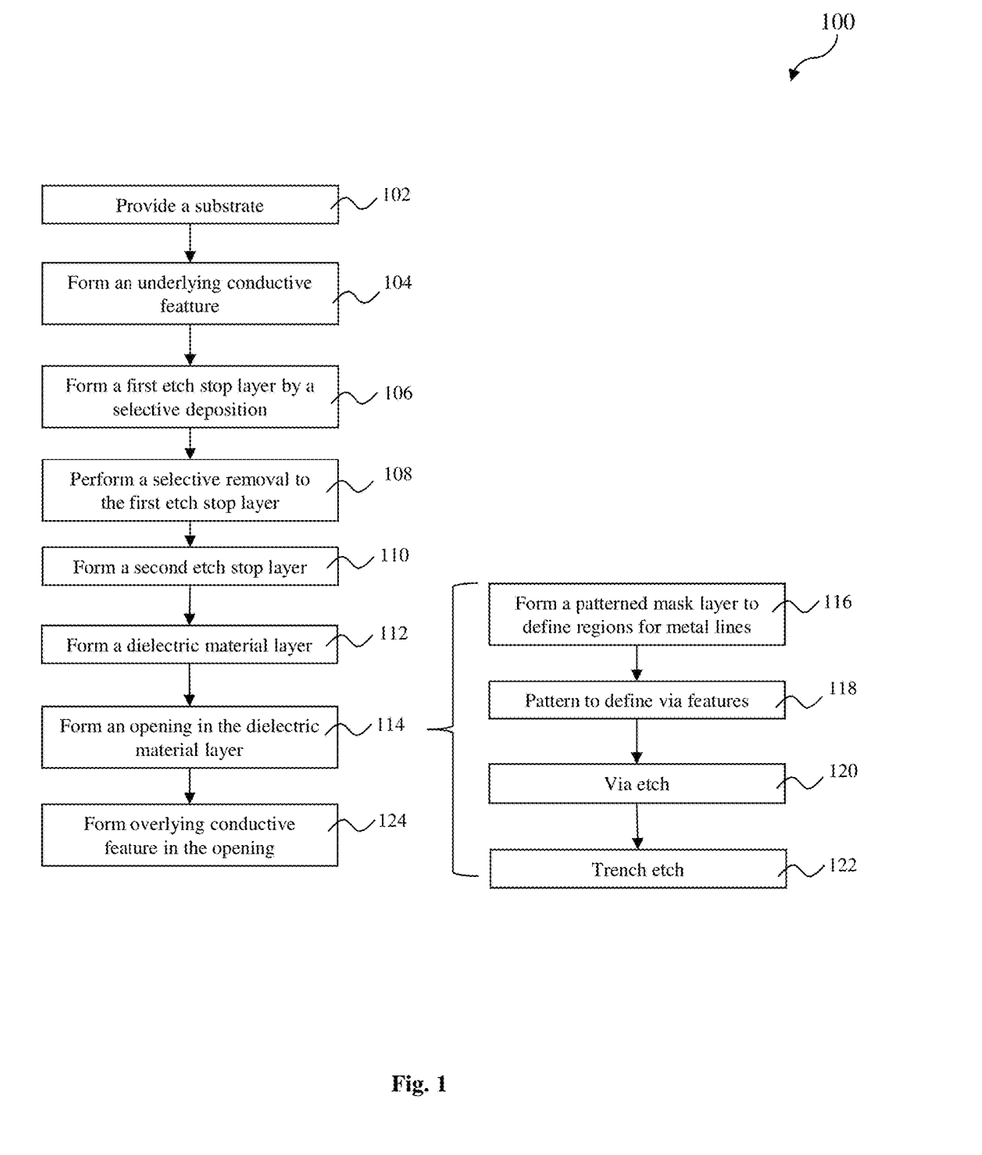
FIG. 1 is a flowchart of one embodiment of a method to form an integrated circuit (IC) structure, in accordance with some embodiments.

FIG. 1 is a flowchart of a method 100 to form an integrated circuit in accordance with some embodiments. FIGS. 2 through 9 illustrate sectional views of an exemplary integrated circuit 200 during various fabrication stages of the method 100 in accordance with some embodiments. With reference to FIGS. 1 through 9 and other figures, the method 100 and the exemplary integrated circuit (IC) structure 200 are described below.

Figure 2:
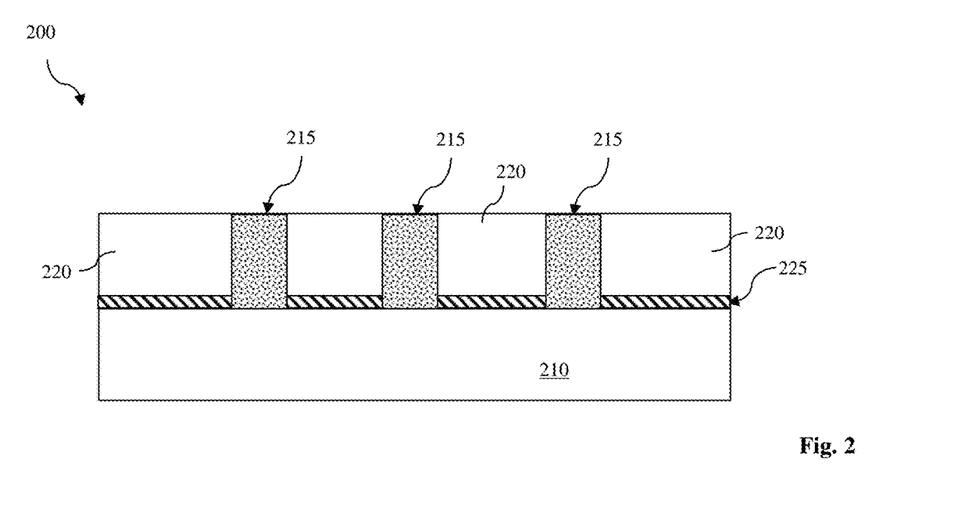
FIGS. 2, 3, 4, 5, 6, 7 and 8 illustrate sectional views of an exemplary integrated circuit structure during various fabrication stages, made by the method of FIG. 1, constructed in accordance with some embodiments.

The method begins at 102 by providing or receiving a substrate 210 as illustrated in FIG. 2. In some embodiments, the substrate 210 includes silicon. Alternatively, the substrate 210 may include other elementary semiconductor such as germanium in accordance with some embodiments. In some embodiments, the substrate 210 additionally or alternatively includes a compound semiconductor such as silicon carbide, gallium arsenic, indium arsenide, and indium phosphide. In some embodiments, the substrate 210 includes an alloy semiconductor such as silicon germanium, silicon germanium carbide, gallium arsenic phosphide, and gallium indium phosphide.

The substrate 210 may include an epitaxial layer formed on the top surface, such as an epitaxial semiconductor layer overlying a bulk semiconductor wafer. In some embodiments, the substrate 210 includes a semiconductor-on-insulator (SOI) structure. For example, the substrate may include a buried oxide (BOX) layer formed by a process such as separation by implanted oxygen (SIMOX). IN various embodiments, the substrate 210 includes various p-type doped regions and/or n-type doped regions, such as p-type wells, n-type wells, p-type source/drain features and/or n-type source/drain features, formed by a process such as ion implantation and/or diffusion. The substrate 210 may include other functional features such as a resistor, a capacitor, diode, transistors, such as field effect transistors (FETs). The substrate 210 may include lateral isolation features configured to separate various devices formed on the substrate 210. The substrate 210 may further include a portion of a multilayer interconnection (MLI) structure. The multilayer interconnection structure includes metal lines in a plurality of metal layers. The metal lines in different metal layers may be connected through vertical conductive features, which are referred to as via features. The multilayer interconnection structure further includes contacts configured to connect metal lines to gate electrodes and/or doped features on the substrate 210. The multilayer interconnection structure is designed to couple various devices features (such as various p-type and n-type doped regions, gate electrodes and/or passive devices) to form a functional circuit.

Still referring to FIGS. 1 and 2, the method 100 includes an operation 104 by forming one or more underlying conductive feature 215 on the substrate 210. In the embodiment illustrated in FIG. 2, three underlying conductive features 215 are formed. In some embodiments, the underlying conductive feature 215 is a metal feature, such as a metal line, a metal via feature or a metal contact feature. In some embodiments, the underlying conductive feature 215 includes both a metal line and a metal via feature, formed by a suitable procedure, such as dual damascene process.

Alternatively, the underlying conductive feature 215 can be other conductive feature as long as the top surface of the underlying conductive feature is able to provide deposition selectivity, such as the top surface of the underlying conductive feature is a metal or metal alloy surface. The deposition selectivity will be further described later. In some embodiments, the underlying conductive feature 215 is a doped semiconductor feature, such as a source/drain feature. In furtherance of the embodiments, silicide is formed on the top surface of the doped semiconductor feature. In some embodiments, the underlying conductive feature 215 is a gate electrode, a capacitor or resistor. In furtherance of the embodiments, metal is formed on the top surface of the gate electrode (such as metal gate), the capacitor (such as metal electrode of the capacitor) or resistor.

In the embodiments illustrated in FIG. 2, the underlying conductive feature 215 is a metal line in one metal layer of the MLI structure. In furtherance of the embodiment, the underlying conductive feature 215 is formed in a first dielectric material layer 220.

In some embodiments, the metal line 215 is formed by a damascene process, which is further described below. The first dielectric material layer 220 is formed on the substrate 210. Alternatively, an etch stop layer (ESL) 225 is formed on the substrate 210 and the first dielectric material layer 220 is formed on the etch stop layer 225. In some embodiments, the first dielectric material layer 220 includes a dielectric material such as silicon oxide, silicon nitride, a low dielectric constant (low k) material, or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SiLK (Dow Chemical, Midland, Mich.), polyimide, porous polymer and/or other suitable materials as examples. A process of forming the first dielectric material layer 220 may utilize chemical vapor deposition (CVD), a spin-on coating or other suitable deposition technology. The etch stop layer 225 includes a material different from the first dielectric material layer 220 designed to provide etch selectivity such that a subsequent etching process is able to substantially etch the first dielectric material layer 220 and stops on the etch stop layer 225. For example, the etch stop layer 225 includes silicon nitride, silicon oxide, silicon oxynitride, silicon carbide or other suitable material that functions to stop the etching of the subsequent etching process. The etch stop layer 225 may be formed by CVD or other suitable technology. After the deposition of (the etch stop layer 225 and) the first dielectric material layer 220, the first dielectric material layer 220 may be further planarized by a technique, such as chemical mechanical polishing (CMP). In some other embodiments, the etch stop layer 225 has a similar structure to the etch stop layer to be formed in the operations 106 through 110 in terms of composition and fabrication.

Thereafter, the first dielectric material layer 220 is patterned to form one or more trench. The trench may be aligned to expose lower conductive features in the substrate 210 such as metal features in a lower metal layer or alternatively doped regions disposed in the semiconductor material of the substrate 210. In some embodiments, an operation to form the trench utilizes a lithography patterning and etching processes know in the art or by a new technique to be developed in the future. For example, a patterned resist layer is formed on the first dielectric material layer 220 by a lithography process that includes resist coating, exposure and developing. The patterned resist layer includes an opening that defines a region for the trench. An etching process is further applied to the first dielectric material layer 220 through the opening of the patterned resist layer, using the patterned resist layer as an etch mask. After the formation of the trench, the patterned resist layer is removed by wet stripping or plasma ashing. Alternatively, a hard mask may be used such that trench pattern is transferred from the patterned resist layer to the hard mask by a first etch and then transferred to the first dielectric material layer by a second etch.

A conductive material is then filled in the trench to form the underlying conductive feature 215. In various embodiments, the conductive material includes copper, aluminum, cobalt, or tungsten. In some other embodiments, the conductive material may include titanium, metal silicide, metal alloy, or combinations thereof. In the present embodiment, the underlying conductive feature 215 includes copper and has multiple films. In furtherance of the embodiment, the underlying conductive feature 215 includes a barrier layer lining the trench and copper filled in the trench. In one example, the underlying conductive feature 215 is formed by a procedure that includes depositing a barrier layer on sidewalls of the trench; forming a copper seed layer by sputtering; and filling the bulk copper in the trench by plating. The barrier layer may include titanium, titanium nitride, tantalum, tantalum nitride or a combination thereof; and may be formed by sputtering. Afterward, a CMP process may be applied to remove excessive copper and planarize the top surface.

Figure 3:
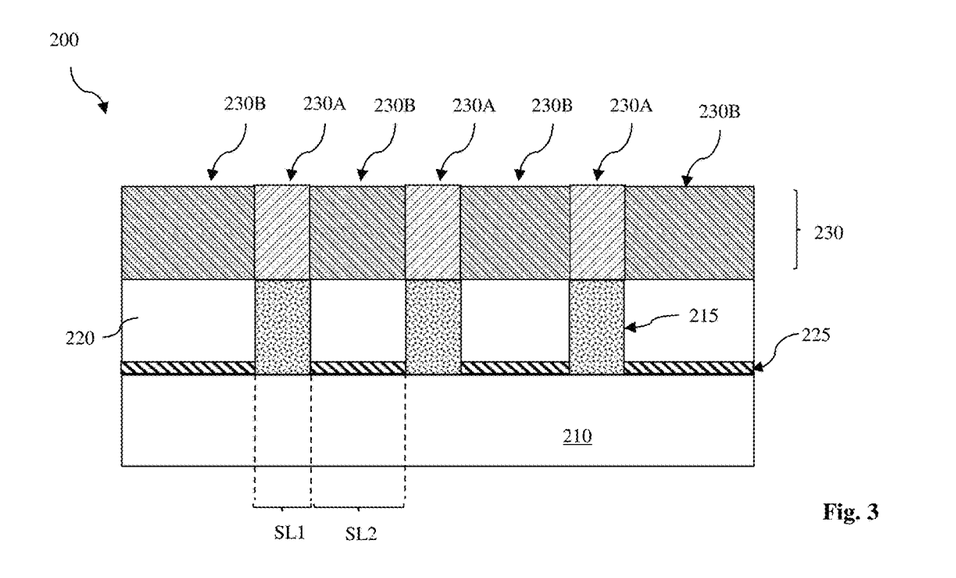

Referring to FIGS. 1 and 3, the method 100 proceeds to operation 106 by depositing a etch stop layer 230 on the first dielectric material layer 220 and the underlying conductive features 215 by a selective deposition. Thus formed etch stop layer 230 includes first portions 230A and second portions 230B, which are different from each other in composition. Furthermore, the first portions 230A and the second portions 230B are self-aligned with the underlying conductive features 215 and the first dielectric material layer 220, respectively, due to different underlying surface (metal surface and dielectric surface) during the selective deposition.

In some embodiments, the etch stop layer 230 is a metal oxide that includes the first portions 230A with less oxygen concentration (therefore also referred to as the oxygen-poor portions 230A) and the second portions 230B with greater concentration (therefore also referred to as the oxygen-rich portions 230B). Particularly, the oxygen-poor portions 230A have a first oxygen concentration and the oxygen-rich portions 230B have a second oxygen concentration greater than the first oxygen concentration. The oxygen-poor portions 230A are self-aligned with the first conductive features and the oxygen-rich portions 230B are self-aligned with the segments of the first dielectric material layer 220. In some examples, the etch stop layer 230 has a thickness ranging between 10 nm and 20 nm. The oxygen-poor portions 230A and the oxygen-rich portions 230B are different in composition such that to provide etch selectivity in the subsequent etching process (in the operation 108), such as the etch selectivity being greater than 3 in one embodiment.

In the metal oxide, some metal atoms are bonded with oxygen atoms and some metal atoms are not. When the metal oxide has a higher oxygen concentration, more metal atoms are bonded with oxygen. Metal oxygen bonding (M-O bonding) concentration is defined as the number of the metal atoms bonded with oxygen over the total number of the metal atoms in a given volume. The M-O bonding concentration may be simply referred to as oxygen concentration in the following description. The oxygen-poor portions 230A have a first M-O bonding concentration (or first oxygen concentration) and the oxygen-rich portions 230B have a second M-O bonding concentration (second oxygen concentration) greater than the first oxygen concentration. In some examples, the oxygen-poor portions 230A have a first metal-oxygen bonding concentration less than 50%, and the oxygen-rich portions 230B have a second metal-oxygen bonding concentration greater than 80%. In other embodiments, the oxygen-poor portions 230A have a first metal-oxygen bonding concentration less than 30%, and the oxygen-rich portions 230B have a second metal-oxygen bonding concentration greater than 95%. In a particular example, the oxygen-poor portions 230A have a first metal-oxygen bonding concentration about 30%, and the oxygen-rich portions 230B have a second metal-oxygen bonding concentration about 99%.

In some embodiments, the etch stop layer 230 is a metal oxide selected from the group consisting of hafnium oxide, zirconium oxide, aluminum oxide or a combination thereof. In the present embodiment, the etch stop layer 230 is formed by atomic layer deposition (ALD). In furtherance of the embodiments, the formation of the etch stop layer 230 uses a metal-containing chemical and an oxygen-containing chemical (such as sequentially) in each cycle of the ALD process. For examples, the metal-containing chemical includes Tetrakis(ethylmethylamino) hafnium (TEMA-Hf), Tetrakis(ethylmethylamido) zirconium (TEMA-Zr), Trimethyl Aluminum (TMA), Tris(dimethylamido) aluminum (TDMAA), and a combination thereof. In various examples, TEMA-Hf is used to form hafnium oxide; TEMA-Zr is used to form zirconium oxide; and TMA or TDMAA is used to form aluminum oxide. The oxygen-containing chemical includes oxygen molecules ($O_2$), ozone ($O_3$), water ($H_2O$) or a combination thereof, according to some embodiments.

The etch stop layer 230 may be formed by a proper ALD process, such as thermal ALD with an elevated temperature, plasma ALD with plasma enhancement, or thermal plus plasma ALD. In some embodiments, the ALD process to form the etch stop layer 230 includes a process temperature ranging between 200° C. and 400° C. In some embodiments, the ALD process to form the etch stop layer 230 includes a process temperature ranging between 50° C. and 100° C., and a vapor pressure ranging between 0.05 Torr and 0.5 Torr for the metal-containing chemical. In one example, the ALD process to form the etch stop layer 230 includes a process temperature at about 70° C. and a vapor pressure ranging between 0.05 Torr to 0.2 Torr for TEMA-Hf or TEMA-Zr. In another example, the ALD process to form the etch stop layer 230 includes a process temperature at about 70° C. and a vapor pressure ranging between 0.1 Torr to 0.4 Torr for TMA. In yet another particular example, the ALD process to form the etch stop layer 230 includes a process temperature at about 70° C. and a vapor pressure ranging between 50 Torr to 200 Torr for TDMAA.

Figure 4:
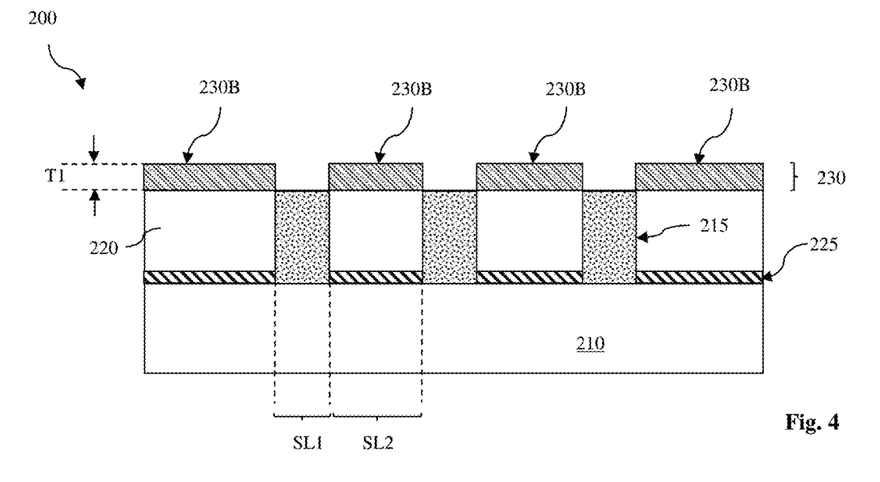

Referring to FIGS. 1 and 4, the method 100 proceeds to operation 108 by performing a selective removal to the etch stop layer 230, thereby selectively removing the oxygen-poor portions 230A of the etch stop layer 230. The remaining portions, which as the oxygen-rich portions 230B, of the etch stop layer 230 are aligned with the segments of the dielectric material layer 220. The selective removal includes an etching process designed to selectively remove the oxygen-poor portions 230A relative to the oxygen-rich portions 230B, the conductive features 215 and the dielectric material layer 220. After the operation 108, the oxygen-rich portions 230B may have a certain loss but still has enough thickness to function as an etch stop layer in a later operation. In some embodiments, the remaining thickness T1 of the oxygen-rich portions 230B is greater than 2 nm. In some examples, the remaining thickness of the oxygen-rich portions 230B ranges between 2 nm and 10 nm.

In some embodiments, the selective removal includes a selective wet clean removal with an etch selectivity between the oxygen-poor portions 230A and the oxygen-rich portions 230B, such as an etch selectivity greater than 3. The wet clean removal uses a wet clean solution having water ($H_2O$) more than 50% in volume and hydrogen peroxide ($H_2O_2$) more than 5% in volume. In some embodiments, the wet clean solution has a pH value ranging between 7 and 9. In furtherance of the embodiments, the wet clean removal further includes a wet etchant that has a wet clean component; a metal-oxide removal component; and an inhibitor component.

In some examples, the wet clean component is selected from the group consisting of Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl)benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol) bis(amine), (2-Methylbutyl) amine, Tris(2-ethylhexyl)amine, (4-Isothiocyanatophenyl) (3-methylphenyl)amine, Poly(ethylene glycol) methyl ether amine, Poly(ethylene glycol) diamine, and a combination thereof. In some example, the metal-oxide removal component is selected from the group consisting of Triethanolamine hydrochloride, Triethanolamine, Trolamine, Trolamine salicylate, 2-Chloroethyl vinyl ether, 2-[4-(Dimethylamino)phenyl]ethanol,
Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, 1-Acetylguanidine, and a combination thereof. In some example, the inhibitor component is selected from the group consisting of 1-Chlorobenzotriazole, 5-Chlorobenzotriazole, 5-Methyl-1H-benzotriazole, 1-methyl-1H-1,2,3-benzotriazole-5-carbaldehyde, 1-Methyl-1H-1,2,3-benzotriazol-5-amine, 1-Methylimidazole, 2-Mercapto-1-methylimidazole, 1-Methylimidazole-2-sulfonyl chloride, 5-Chloro-1-methylimidazole, 5-Iodo-1-methylimidazole, Thiamazole, 1-Methylimidazolium chloride, 2,5-Dibromo-1-methyl-1H-imidazole, 1H-Benzotriazole-4-sulfonic acid, BTA-like, and a combination thereof.

Figure 5:
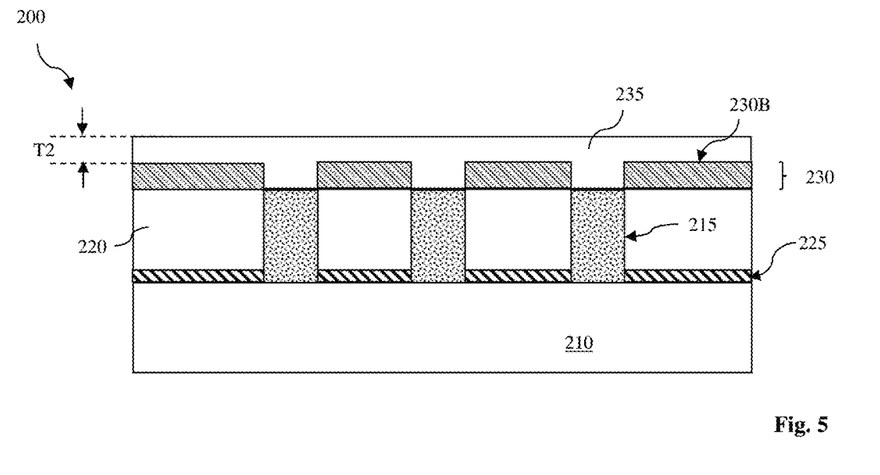

Referring to FIGS. 1 and 5, the method 100 may proceed to operation 110 by forming a second etch stop layer 235 on the first etch stop layer 230 and on the conductive features 215 within the openings of the first etch stop layer 230. The second etch stop layer 235 is different from the first etch stop layer 230 in composition. In some embodiments, as the first etch stop layer 230 includes metal oxide and the second etch stop layer 235 includes a metal-free dielectric material, such as silicon oxide, silicon nitride, silicon oxynitride, silicon carbide and a combination thereof. The formation of the second etch stop layer 235 may include CVD or other suitable deposition. In one example, the formation of the second etch stop layer 235 includes a flowable CVD to form silicon oxide. In some embodiment, the second etch stop layer 235 has a thickness $T_2$ ranging between 0.5 nm and 2 nm.

Figure 6:
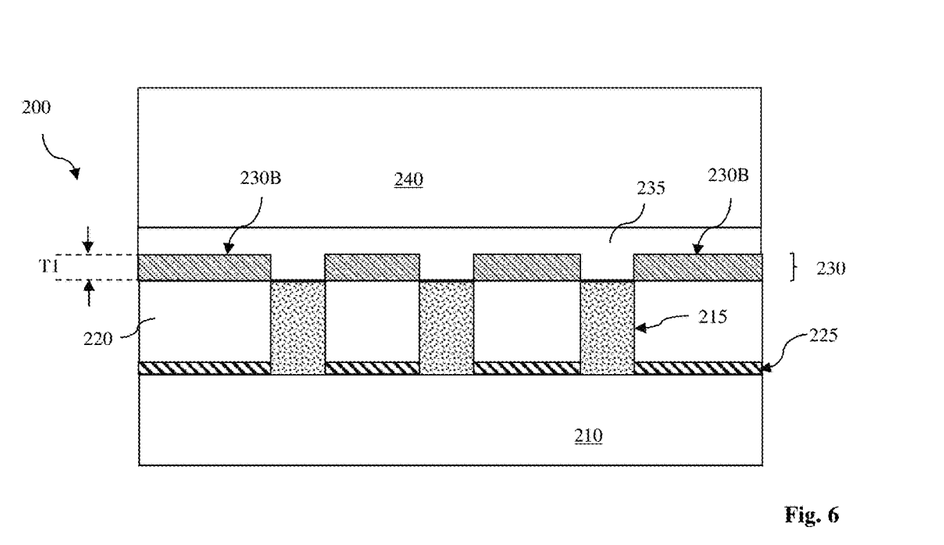

Referring to FIGS. 1 and 6, the method 100 proceeds to operation 112 by forming a second dielectric material layer 240 on the IC structure 200. The second dielectric material layer 240 is formed on the second ESL 235. In some embodiments, the second dielectric material layer 240 includes silicon oxide, silicon nitride, a low k material, or a combination thereof. The formation of the second dielectric material layer 240 may include CVD, a spin-on coating or other suitable deposition technology. In some embodiments, the second dielectric material layer 240 is similar to the first dielectric material layer 220 in term of composition and deposition. After the deposition of the second dielectric material layer 240, a CMP process may be applied to planarize the top surface of the IC structure 200.

Figure 7:
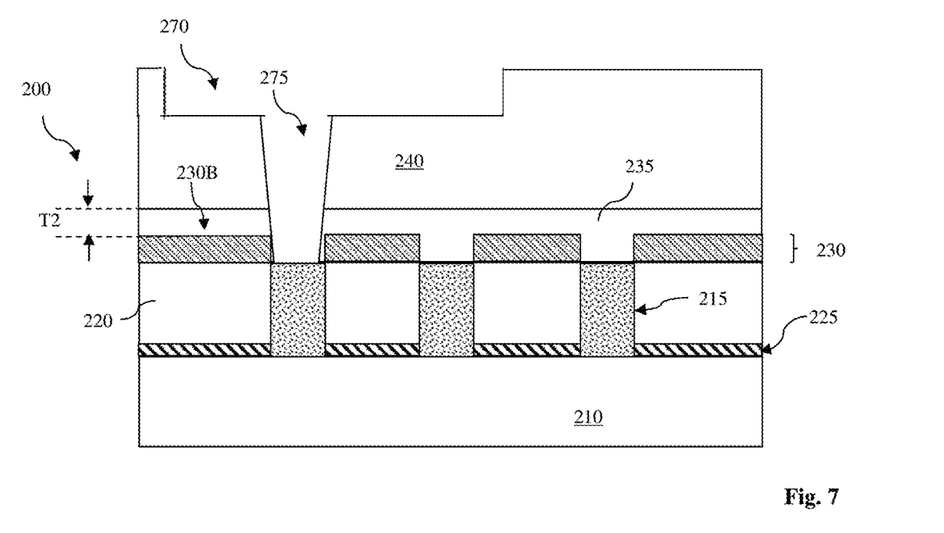

Referring to FIGS. 1 and 7, the method 100 proceeds to operation 114 by forming an opening in the second dielectric material layer 240. The operation 114 may include a suitable damascene process, such as single damascene process to form trenches for metal lines or vertical vias for via features; or alternatively a dual damascene process to form both trenches for metal lines and vertical vias for via features. In the present embodiment, the opening is formed by a dual damascene process and includes a trench 270 and a via 275. The formation of the opening includes lithography patterning and etching.

Figure 10:
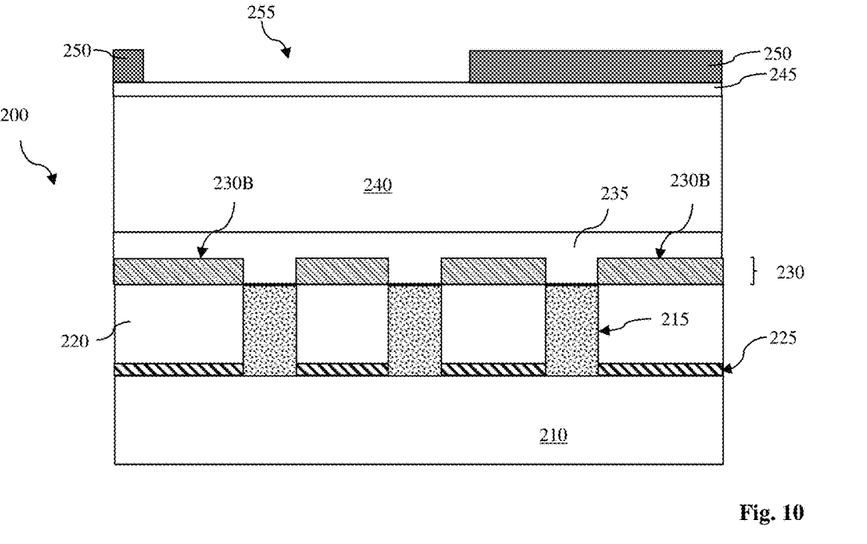
FIGS. 10, 11 and 12 illustrate sectional views of an exemplary integrated circuit structure during various fabrication stages, made by the method of FIG. 1, constructed in accordance with some embodiments.
Figure 11:
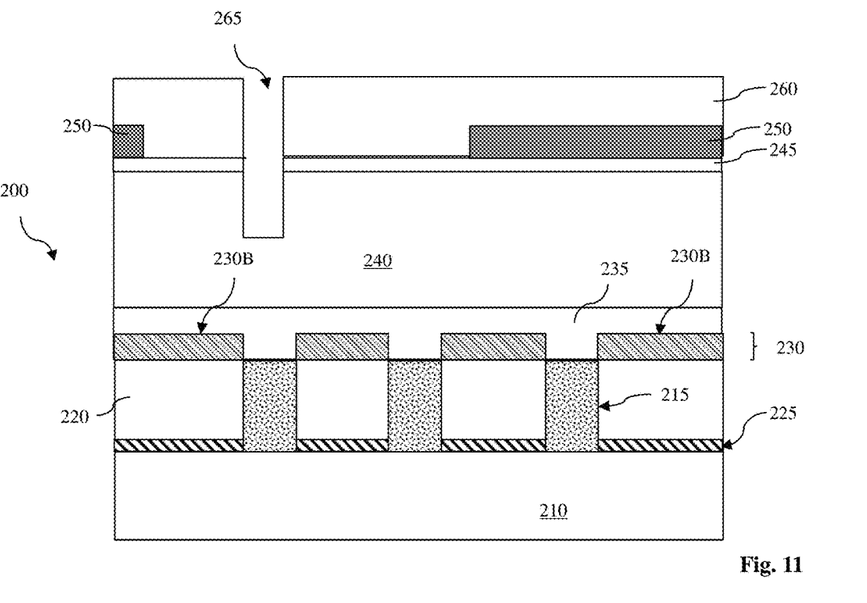
Figure 12:
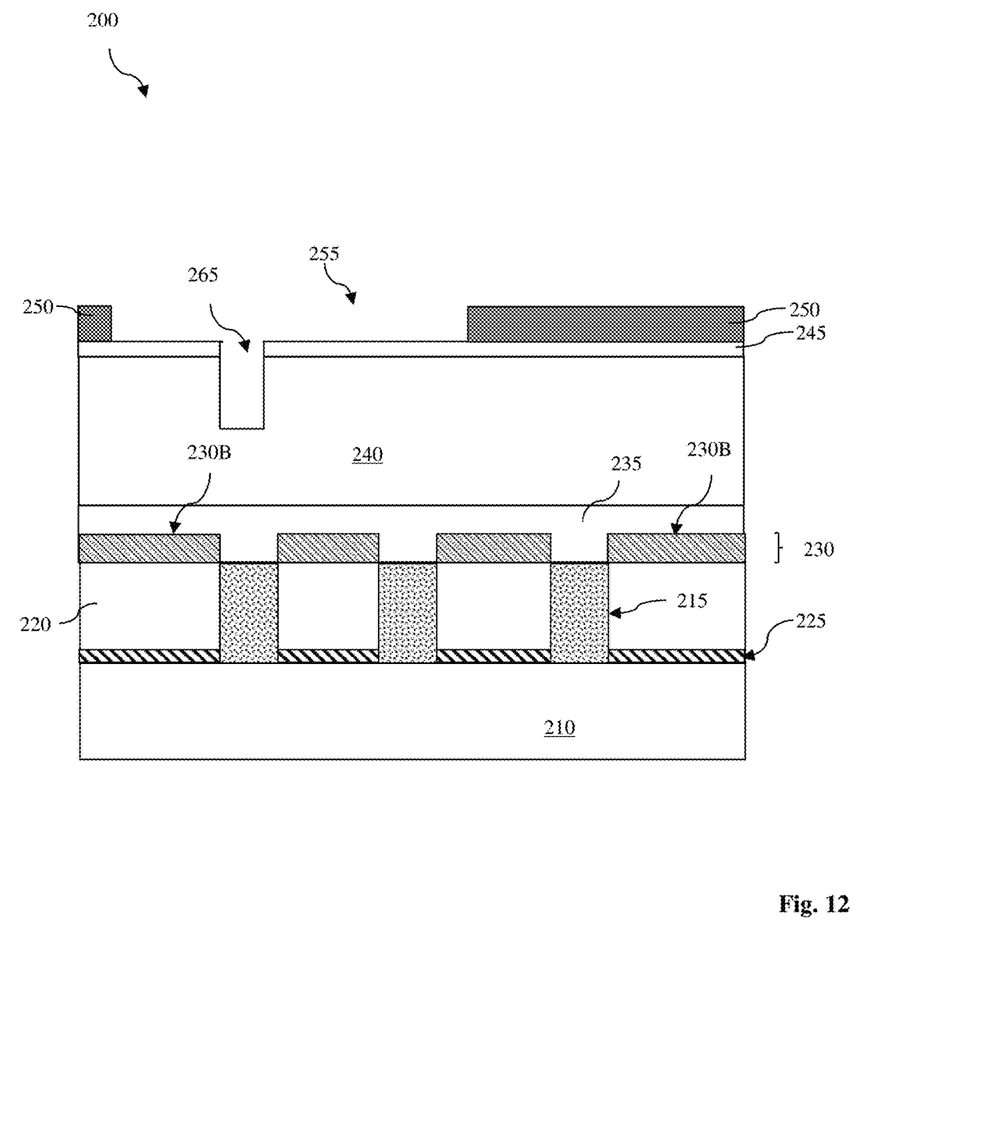

One example of the dual damascene process to form the trench 270 and the via 275 is illustrated in FIGS. 10-12 and is described below.

Referring to block 116 of FIG. 1 and FIG. 10, a patterned mask layer is formed on the second dielectric material layer 240 to define the trench. In some embodiments, an anti-reflective coating (ARC) film 245 is further formed on the second dielectric material layer 240 to reduce the reflection during subsequent lithography patterning or additionally provide other functions. In one example, the ARC film includes a nitrogen-free ARC (NFARC) material. NFARC material reduces resist poisoning in sensitive photoresists and may include silicon oxide and may additionally include carbon, such as carbon-doped silicon oxide.

A mask layer 250 is further formed on the IC structure 200. In some embodiments, the mask layer 250 is a resist layer. In some other embodiments, the mask layer 250 includes a hard mask material, such as silicon nitride or silicon oxynitride.

Thereafter, the mask layer 250 is patterned by a lithography process, thereby forming a patterned mask layer 250 having one (or more) opening 255 to define a region (or regions) for metal line (or metal lines), as illustrated in FIG. 10. The metal line refers to a metal line in an upper metal layer to be formed. In some embodiments, the mask layer 250 is a resist layer, the patterning process is a lithography procedure that includes spin-on coating, exposure and developing. In some embodiments, the mask layer 250 is a hard mask, the patterning process includes forming a patterned resist layer on the hard mask 250 using a lithography process; and etching the hard mask through the opening of the patterned resist layer using the patterned resist layer as an etch mask. After the formation of the patterned hard mask, the patterned resist layer may be removed by plasma ashing or wet stripping.

Referring to block 118 of FIG. 1 and FIG. 11, a patterning process is applied to define a region for a via feature (or via features). In some embodiments, a patterned resist layer 260 is formed on the IC structure 200 by a lithography process that includes spin-on coating, exposure and developing. The patterned resist layer 260 includes one (or more) opening 265 that defines a via feature. The via feature defined by the opening 265 and the metal line defined by the opening 255 are overlapped in the top view (as illustrated in FIG. 11) so that the corresponding metal line is connected with the corresponding via feature. Furthermore, the via feature defined by the opening 265 and the underlying conductive feature 215 are overlapped in the top view so that the corresponding via feature is connected with the underlying conductive feature 215.

Referring to block 120 of FIG. 1 and FIG. 12, a via etching process is applied to the second dielectric material layer 240. The second dielectric material layer 240 (and the ARC layer 245 if it is present) is recessed through the opening 265 by a first etching process using the patterned resist layer 260 as an etch mask. The first etching process is designed and tuned to partially etch the second dielectric material layer 240 such that the recessed portion is not completely through the second dielectric material layer 240. For example, the second dielectric material layer 240 is etched to about half of its thickness. In some embodiments, the first etching process is controlled by the etching duration. Afterward, the patterned resist layer 260 is removed by plasma ashing or wet stripping, as illustrated in FIG. 12.

Referring to block 122 of FIG. 1 and FIG. 7, a trench etching process is applied to the second dielectric material layer 240. The second dielectric material layer 240 (and the ARC layer 245 if it is present) is further etched through the opening 255 of the hard mask 250 by a second etching process using the hard mask 250 as an etch mask. The second etching process is designed to selectively etch the second dielectric material layer 240 while the second ESL 235 substantially remains intact. The second etching process is implemented to partially etch the second dielectric material layer 240, such as by controlling the etching duration. During the second etching process, the second dielectric material layer 240 within the region defined by the opening 255 is only recessed but not completely through the second dielectric material layer 240. However, the second dielectric material layer 240 within the region defined by the opening 265 is recessed by the first etching process and is further etched by the second etching process through the second dielectric material layer 240, therefore reaching the ESL 235. Accordingly, both the trench 270 for metal and the via (via opening) 275 for the via feature are collectively formed in the second dielectric material layer 240. The trench 270 is formed in the upper portion of the second dielectric material layer 240 and the via 275 is formed in the lower portion of the second dielectric material layer 240, as illustrated in FIG. 7.

In some embodiments, the second etching process includes dry etch, wet etch or a combination thereof. The second etching process is designed with an etchant to have etching selectivity such that the second etching process substantially removes the second dielectric material layer 240 while keeps the ESL 235 intact. In some embodiments, the etchants used in the first and second etching process are same. In some embodiments, the second etching process is a dry etch with more etching directionality. In some embodiments, the etchant in the second etching process includes fluorine-containing gas (such as CxFy, which x and y are proper integers), oxygen-containing gas (such as O2), other suitable etching gas or a combination thereof.

After the formation of the trench 270 and the via 275, a third etching process, such as a wet etch, is applied to open the second ESL 235. In some embodiments, the second ESL 235 includes a metal-free dielectric material (such as silicon nitride); and the first etch stop layer 230 is a metal oxide. The third etching process is designed to selectively etch the second ESL 235 relative to the first ESL 230. For examples, the ESL 235 includes silicon oxide; and the third etching process includes hydrofluoric acid. In some examples, the ESL 235 includes silicon oxide; and the third etching process includes hydrofluoric acid.

Figure 8:
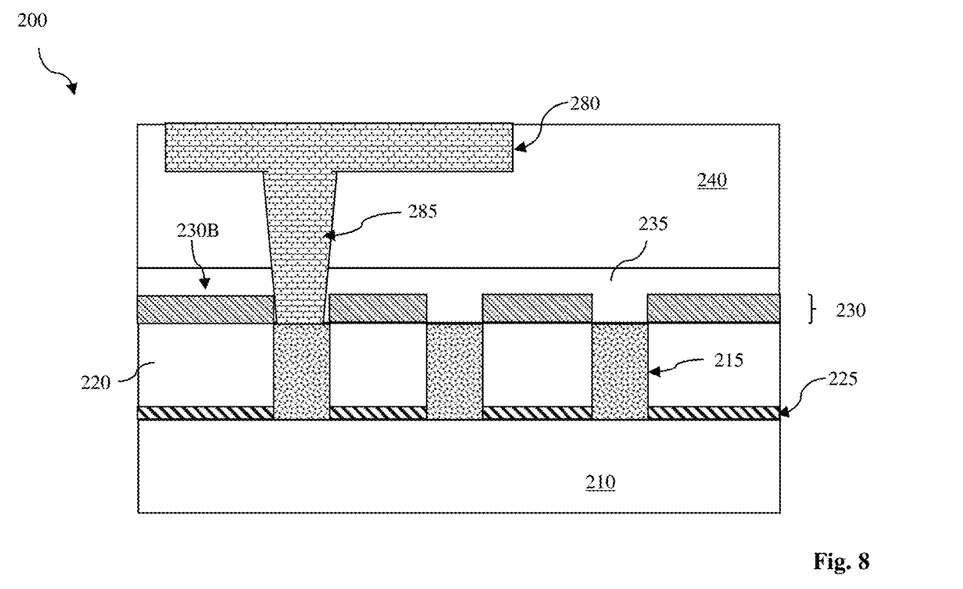
Figure 9:
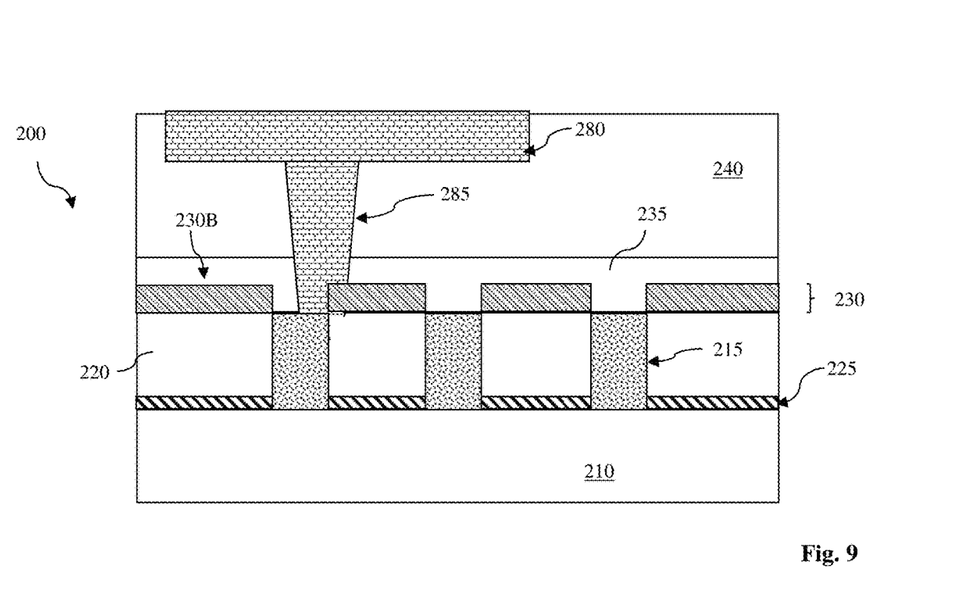
FIG. 9 illustrates a sectional view of an integrated circuit structure by the method of FIG. 1 in accordance with some embodiments.

Referring to FIG. 1, after the formation of the opening, the method 100 proceeds to operation 124 to form an overlying conductive feature in the opening, as illustrated in FIG. 8. The overlying conductive feature is electrically connected with one of the underlying conductive feature 215. In the illustrated embodiment, the opening includes a trench 270 and a via 275, the overlying conductive feature includes a metal line 280 formed in the trench 270 and the via feature 285 formed in the via 275. It is noted that the term "via 275" (or "via opening 275") refers to a void space in the second dielectric material layer and the term "via feature 285" refers to a conductive feature formed in the corresponding void space. In the operation 124, a conductive material is filled in the trench 270 and the via 275, thereby forming the metal line 280 in the trench 270 and the via feature 285 in the via 275. The metal line 280 is electrically connected with one of the underlying conductive features 215 through the via feature 285. The via feature 285 and the metal line 280 are collectively referred to as overlying conductive feature. In various embodiments, the conductive material includes copper, aluminum, cobalt or tungsten. In some other embodiments, the conductive material may include titanium, polysilicon, metal silicide, metal alloy, or combinations thereof. In some embodiments, the overlying conductive feature is similar to the underlying conductive feature 215 in terms of composition and formation. In the present embodiment, the overlying conductive feature includes copper and has multiple films. In furtherance of the embodiment, the overlying conductive feature includes a barrier layer lining the trench and copper filled in the trench. In one example, the overlying conductive feature is formed by a procedure that includes depositing a barrier layer on sidewalls of the trench; forming a copper seed layer by sputtering; and filling the bulk copper in the trench by plating. The barrier layer may include titanium, titanium nitride, tantalum, tantalum nitride, other suitable material, or a combination thereof; and may be formed by sputtering. Afterward, a CMP process may be applied to remove excessive copper and planarize the top surface. In some embodiments, the ARC layer 245 and the hard mask 250 are removed as well by the CMP process or another etching process. In some examples, the ARC layer 245 and the hard mask 250 are removed by another etching process after the CMP process or before the CMP process.

As mentioned above, the via 275 is defined by the opening 265 of the patterned resist layer 260 using a lithography process. The opening 265 is expected to be aligned with the underlying conductive feature 215. However, the lithography process has intrinsic misalignment. When the spaces between adjacent metal lines get smaller and smaller, and the misalignment tolerances get smaller and smaller, which is a challenge to the corresponding lithography process. Furthermore, the misalignment between the metal line and the via feature may further introduce quality and reliability issues. For example, the reliability tests, such as time dependent dielectric breakdown test (TDDB), may have a concern. The disclosed method 100 provides a self-aligned process so that the misalignment between the underlying conductive feature 215 and the via feature 285 is constrained and minimized. Accordingly, the via feature 285 is self-aligned with the underlying conductive feature 215. This is explained below.

As illustrated in FIG. 4, the first ESL 230 is patterned to have various segments (the oxide-rich portions 230B) aligned with various segments of the first dielectric material layer 220, respectively. When a misalignment occurs, as illustrated in FIG. 8, the via 275 is landing on the oxide-rich portions 230B of the first ESL 230. Due to the etch selectivity, the third etching process will etch through the second ESL 235 but cannot etch through the first ESL 230. Considering the etching selectivity and self-aligned first ESL 230, the via 275 is constrained to be aligned with the underlying conductive feature 215. Accordingly, the IC structure 200 has am improved reliability, such as better TDDB.

Figure 13:
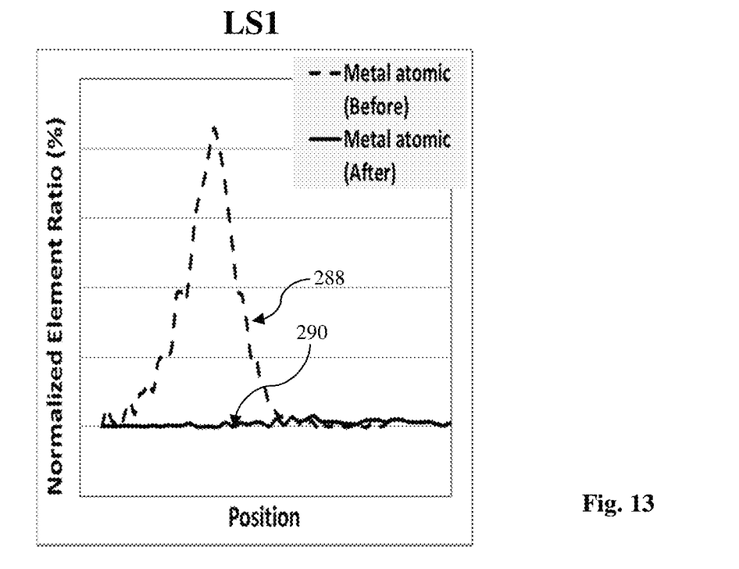
FIGS. 13 and 14 illustrate various data associated with the integrated circuit structure of FIGS. 3 and 4 in accordance with some embodiments.
Figure 14:
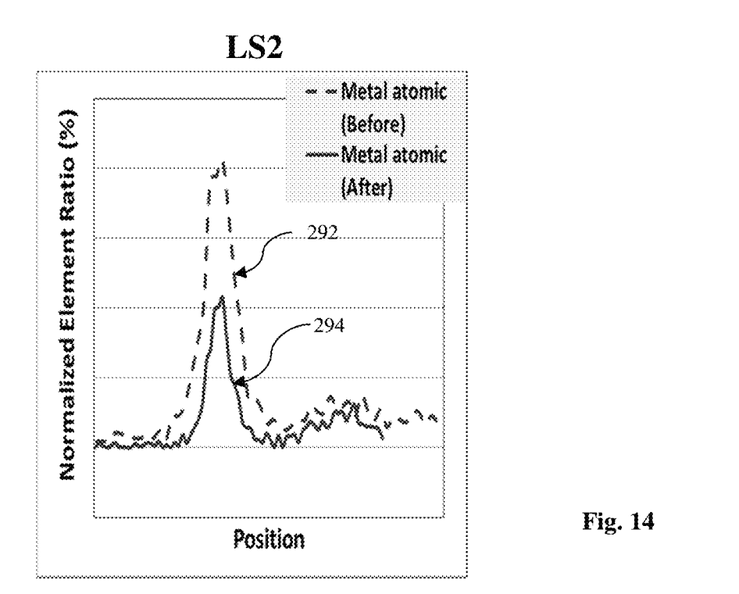

The disclosed method provides a self-aligned etch stop layer with various segments aligned with the segments of the underlying dielectric material layer, respectively. Such tiger-tooth structure of the etch stop layer, with its self-alignment, provides constrain to the vias such that the via features are self-aligned with the underlying conductive features. The effectiveness of the self-aligned tiger tooth etch stop layer 230 is further verified through the experiments, such as by an X-ray scanning electron microscopy (SEM) with Energy Dispersive X-ray Spectroscopy (EDS). Constructed according to some examples, FIG. 13 illustrates a first metal atomic concentration (%) 288 along the scan-line 1 ("SL1") before the selective removal by the operation 108 (as illustrated in FIG. 3) and a second metal atomic concentration (%) 290 along the scan-line 1 after the selective removal by the operation 108 (as illustrated in FIG. 4); and FIG. 14 illustrates a third metal atomic concentration (%) 292 along the scan-line 2 ("SL2") before the selective removal by the operation 108 (as illustrated in FIG. 3) and a forth metal atomic concentration (%) 294 along the scan-line 2 after the selective removal by the operation 108 (as illustrated in FIG. 4). Here a metal atomic concentration refers the metal atomic concentration of the metal oxide in the etch stop layer 230, such as hafnium, zirconium, or aluminum. The experimental data in FIGS. 13 and 14 show that the metal atomic concentration is reduced to zero in the line-scan 1 while that the metal atomic concentration remains a certain level in the line-scan 2, which indicates that the oxide-poor portions 230A are removed while the oxide-rich portions 230B are remained with a certain thickness.

The present disclosure provides an IC structure and a method making the same. Particularly, the method includes an operation to recess the underlying conductive feature. The first ESL 230 formed on the first dielectric material layer 220 is has a tiger-tooth structure self-aligned with the segments of the first dielectric material layer 220. By implementing the disclosed method in various embodiments, some of advantages described below may present. However, it is understood that different embodiments disclosed herein offer different advantages and that no particular advantage is necessarily required in all embodiments. As one example, by forming the tiger-tooth ESL 230 self-aligned with the underlying dielectric segments 220, the via feature 285 is constrained to be aligned with the underlying conductive feature 215. Accordingly, the IC structure formed by the disclosed method has a better TDDB than an IC structure formed otherwise.

Other embodiments and modifications may be implemented without departing from the spirit of the present disclosure. In some examples, the underlying conductive feature 215 includes a metal line and is formed by a single damascene process. In some other examples, the underlying conductive feature 215 includes a metal line and a via feature, formed by a dual damascene process. In some embodiments, the dual damascene process to form the underlying conductive feature 215 may be similar to the dual damascene process to form the overlying conductive feature (the via feature 285 and the metal line 280). In some embodiments, the dual damascene process to form the underlying conductive feature 215 or the overlying conductive feature may be a different procedure, such as a dual damascene process with a trench-first procedure, in which, trench for metal line is patterned first and then the via for via feature is patterned afterward.

In some other embodiments, the second etch stop layer 235 is formed conformal to the tiger-tooth first ESL 230 and includes bottom portions in the openings of the first ESL 230 and sidewall portions on the sidewalls of the first ESL 230. In this case, the second ESL 235 has dips aligned with the underlying conductive features 215, Considering the etching selectivity and the relative greater thickness of the second ESL 130 in the sidewall portions, even the second ESL 235 functions to constrain the vias 275 aligned with the underlying conductive features 215, in addition to the constrain function of the tiger-tooth first ESL 230.

In some other embodiments, the overlying conductive feature includes via feature formed by a single damascene process. In yet some other embodiments, the overlying conductive feature includes metal line formed by a single damascene process. In this case, the operations 116 through 124 in the method 100 are replaced by a single damascene process. In a particular example, the single damascene process includes forming a patterned mask 250 as illustrated in FIG. 10. This operation is similar to the operation 116. However, the opening 255 in the patterned mask 250 may define a metal line or a via feature. The single damascene process further includes performing an etching process through the second dielectric material layer 240 using the patterned mask layer 250 as an etch mask. This operation is similar to the operation 122. However, the etching process in the single damascene process etches from the top surface of the second dielectric material layer 240, all way down to the ESL 235, thereby forming a trench for a metal line for a via feature. Afterward, the ESL 235 may be opened by a wet etch.

In the method 100, a patterning process is used to pattern various material layers, such as patterning the mask layer 250 or forming a patterned resist layer 260. In various examples, the patterning process is a lithography process that includes exposing a resist layer to a radiation beam. The radiation beam may be a photon beam. For example, the resist layer on a semiconductor wafer may be exposed to an ultraviolet (UV) light through a mask having a predefined pattern. The exposing process may be implemented using a stepper by a step-and-repeat method or using a scanner by a step-and-scan method. Other options to the radiation beam other than photon beams include electron beam and ion beam. For example, the resist layer may be exposed to an electron beam (e-beam) by an e-beam exposure system (e-beam writer). A pattern may be written to the resist layer according to a predefined pattern using the e-beam writer. The exposing process may be further extended to include other technologies such as a maskless exposing or writing process. After the exposing process, the resist layer may be is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. The lithography processes described above may only present a subset of processing steps associated with a lithography patterning technique. The lithography process may further include other steps such as cleaning and baking in a proper sequence. For example, the developed resist layer may be further baked, referred to as hard baking. The lithography processes implemented in the method may have other variations. For example, an anti-reflective coating may be disposed overlying the resist layer, referred to as top ARC (TAR). The resist may be negative type so that the PEB process may decrease the solubility of the exposed resist layer.

Thus, the present disclosure provides a method of fabricating an integrated circuit in accordance with some embodiments. The method includes providing a substrate having a first dielectric material layer and first conductive features that are embedded in the first dielectric material layer and are laterally separated from each other by segments of the first dielectric material layer; depositing a first etch stop layer on the first dielectric material layer and the first conductive features, thereby forming the first etch stop layer having oxygen-rich portions self-aligned with the segments of the first dielectric material layer and oxygen-poor portions self-aligned with the first conductive features; performing a selective removal process to the first etch stop layer, thereby selectively removing the oxygen-poor portions of the first etch stop layer; forming a second etch stop layer on the first conductive features and the oxygen-rich portions of the first etch stop layer; forming a second dielectric material layer on the second etch stop layer; and forming a conductive structure in the second dielectric material layer, wherein the conductive structure is electrically connected with at least one of the first conductive features.

The present disclosure also provides a method of fabricating an integrated circuit in accordance with some embodiments. The method includes providing a substrate having conductive features laterally separated from each other by dielectric features; depositing a metal oxide layer on the substrate, thereby forming the metal oxide layer with oxygen-rich portions self-aligned with the dielectric features and oxygen-poor portions self-aligned with the conductive features; performing a selective removal process to the metal oxide layer, thereby selectively removing the oxygen-poor portions of the metal oxide layer; forming a dielectric material layer; and forming a conductive structure in the dielectric material layer.

The present disclosure provides an integrated circuit structure in accordance with some embodiments. The integrated circuit structure includes a substrate having first and second underlying conductive features laterally separated from each other by dielectric features; a first etch stop layer having first and second openings aligned with the first and second underlying conductive features, respectively; a second etch stop layer formed on the first etch stop layer and in the second opening of the first etch stop layer, wherein the second etch stop layer is different from the first etch stop layer in composition; a second dielectric material layer disposed on the second etch stop layer; and an overlying conductive feature formed in the second dielectric material layer, landing on the first underlying conductive feature, and electrically connected with the first underlying conductive feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating an integrated circuit, comprising:
   providing a substrate having a first dielectric material layer and first conductive features that are embedded in the first dielectric material layer and are laterally separated from each other by segments of the first dielectric material layer;
   depositing a first etch stop layer on the first dielectric material layer and the first conductive features, thereby forming the first etch stop layer having oxygen-rich portions self-aligned with the segments of the first dielectric material layer and oxygen-poor portions self-aligned with the first conductive features;
   performing a selective removal process to the first etch stop layer, thereby selectively removing the oxygen-poor portions of the first etch stop layer;
   forming a second etch stop layer on the first conductive features and the oxygen-rich portions of the first etch stop layer, wherein the second etch stop layer is different from the first etch stop layer in composition;
   forming a second dielectric material layer on the second etch stop layer; and
   forming a conductive structure in the second dielectric material layer, wherein the conductive structure is electrically connected with at least one of the first conductive features.

2. The method of claim 1, wherein the forming of the conductive structure in the second dielectric material layer includes
   performing a first etching process to the second dielectric material layer, thereby forming an opening in the second dielectric material layer; and
   forming a second conductive feature in the opening of the second dielectric material layer.

3. The method of claim 2, wherein the forming of the second conductive feature includes filling the opening with a conductive material and polishing the conductive material.

4. The method of claim 2, wherein the forming of the conductive structure includes performing a dual damascene process, thereby forming the second conductive feature having a metal line and a metal via feature, the metal via feature electrically connecting the metal line and the at least one of the first conductive features.

5. The method of claim 2, further comprising performing a second etching process to the second etch stop layer through the opening in second dielectric material layer.

6. The method of claim 1, wherein the depositing of the first etch stop layer includes depositing a metal oxide selected from the group consisting of hafnium oxide, zirconium oxide, aluminum oxide or a combination thereof.

7. The method of claim 6, wherein the depositing of the metal oxide is implemented by an atomic layer deposition using an oxygen-containing chemical and a metal-containing chemical.

8. The method of claim 7, wherein
   the metal-containing chemical is selected from the group consisting of Tetrakis(ethylmethylamino)hafnium (TEMA-Hf), Tetrakis(ethylmethylamido)zirconium (TEMA-Zr), Trimethyl Aluminum (TMA), Tris(dimethylamido) aluminum (TDMAA), and a combination thereof.

9. The method of claim 1, wherein the depositing of the first etch stop layer includes forming the first etch stop layer having the oxygen-rich portions and the oxygen-poor portions, the oxygen-rich portions having a first metal-oxygen bonding concentration greater than 80% and the oxygen-poor portions having a second metal-oxygen bonding concentration less than 40%.

10. The method of claim 1, wherein the performing of the selective removal process to the first etch stop layer includes performing a wet clean process using a wet etching solution such that an etch selectivity between the oxygen-poor portions and the oxygen-rich portions is greater than 3.

11. The method of claim 10, wherein the wet etching solution includes a wet clean component; a metal-oxide removal component; and an inhibitor component.

12. The method of claim 11, wherein
   the wet clean component is selected from the group consisting of Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl)benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol) bis(amine), (2-Methylbutyl)amine, Tris(2-ethylhexyl)amine, (4-Isothiocyanatophenyl)(3-methylphenyl)amine, Poly (ethylene glycol) methyl ether amine, Poly(ethylene glycol) diamine, and a combination thereof;
   the metal-oxide removal component is selected from the group consisting of Triethanolamine hydrochloride, Triethanolamine, Trolamine, Trolamine salicylate, 2-Chloroethyl vinyl ether, 2-[4-(Dimethylamino)phenyl]ethanol, Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, 1-Acetylguanidine, and a combination thereof; and
   the inhibitor component is selected from the group consisting of 1-Chlorobenzotriazole, 5-Chlorobenzotriazole, 5-Methyl-1H-benzotriazole, 1-methyl-1H-1,2,3-benzotriazole-5-carbaldehyde, 1-Methyl-1H-1,2,3-benzotriazol-5-amine, 1-Methylimidazole, 2-Mercapto-1-methylimidazole, 1-Methylimidazole-2-sulfonyl chloride, 5-Chloro-1-methylimidazole, 5-Iodo-1-methylimidazole, Thiamazole, 1-Methylimidazolium chloride, 2,5-Dibromo-1-methyl-1H-imidazole, 1H-Benzotriazole-4-sulfonic acid, BTA-like, and a combination thereof.

13. The method of claim 1, wherein the second etch stop layer includes one of silicon oxide, silicon nitride, silicon oxynitride, silicon carbide and a combination thereof.

14. A method of fabricating an integrated circuit, comprising:
   providing a substrate having conductive features laterally separated from each other by dielectric features;
   depositing a metal oxide layer on the substrate, thereby forming the metal oxide layer with oxygen-rich portions self-aligned with the dielectric features and oxygen-poor portions self-aligned with the conductive features;
   performing a selective removal process to the metal oxide layer, thereby selectively removing the oxygen-poor portions of the metal oxide layer;
   forming a dielectric material layer; and
   forming a conductive structure in the dielectric material layer.

15. The method of claim 14, further comprising forming an etch stop layer on the conductive features and the metal oxide layer after the performing of the selective removal process to the metal oxide layer and before the forming of the dielectric material layer, wherein the conductive structure is electrically connected with at least one of the conductive features through the etch stop layer.

16. The method of claim 15, wherein
the metal oxide layer is selected from the group consisting of hafnium oxide, zirconium oxide, aluminum oxide or a combination thereof; and
the etch stop layer is a dielectric material selected from the group consisting of silicon oxide, silicon nitride, silicon oxynitride, silicon carbide and a combination thereof.

17. The method of claim 14, wherein
the depositing of the metal oxide layer is implemented by an atomic layer deposition using an oxygen-containing chemical and a metal-containing chemical; and
the performing of the selective removal process to the metal oxide layer includes performing a wet etching process using an etchant to have an etch selectivity between the oxygen-poor portions and the oxygen-rich portions.

18. A method comprising:
forming a first conductive feature in a first dielectric layer;
forming a metal oxide layer over the first conductive feature and the first dielectric layer, wherein a first portion of the metal oxide layer disposed over the first conductive feature has a first oxygen concentration and a second portion of the metal oxide layer disposed over the first dielectric layer has a second oxygen concentration that is different than the first oxygen concentration;
removing the first portion of the metal oxide layer to expose a portion of the first conductive feature;
forming an etch stop layer over the exposed portion of the first conductive feature;
forming a second dielectric layer over the etch stop layer;
forming a trench through the second dielectric layer and the etch stop layer to expose the portion of the first conductive feature; and
forming a second conductive feature in the trench.

19. The method of claim 18, wherein forming the etch stop layer over the exposed portion of the first conductive feature includes forming the etch stop layer over the second portion of the metal oxide layer.

20. The method of claim 18, wherein forming the second conductive feature in the trench includes forming the second conductive feature directly on the second portion of the metal oxide layer.

* * * * *